(12) United States Patent
Huang

(10) Patent No.: US 9,927,846 B2
(45) Date of Patent: Mar. 27, 2018

(54) FLASH DRIVE STRUCTURE

(71) Applicant: HOEY CO., LTD., Taoyuan (TW)

(72) Inventor: Joseph Huang, Taoyuan (TW)

(73) Assignee: HOEY CO., LTD., Taoyuan (TW)

( * ) Notice: Subject to any disclaimer, the term of this patent is extended or adjusted under 35 U.S.C. 154(b) by 0 days.

(21) Appl. No.: 15/250,179

(22) Filed: Aug. 29, 2016

(65) Prior Publication Data

US 2018/0059741 A1 Mar. 1, 2018

(51) Int. Cl.
| | |
|---|---|
| *H05K 5/00* | (2006.01) |
| *G06F 1/18* | (2006.01) |
| *H01R 12/72* | (2011.01) |
| *H01R 24/64* | (2011.01) |
| *H05K 5/02* | (2006.01) |
| *H01R 107/00* | (2006.01) |

(52) U.S. Cl.
CPC .......... *G06F 1/181* (2013.01); *H01R 12/721* (2013.01); *H01R 24/64* (2013.01); *H05K 5/0221* (2013.01); *H01R 2107/00* (2013.01)

(58) Field of Classification Search
CPC ................. H05K 5/0278; H05K 3/284; H05K 2201/10159; H05K 5/0221; H01R 13/516; H01R 13/46; H01R 13/506; H01R 12/721; H01R 24/64; H01R 2107/00; G06K 19/07732; G06F 1/181
See application file for complete search history.

(56) References Cited

U.S. PATENT DOCUMENTS

| | | | | |
|---|---|---|---|---|
| 7,307,849 B2* | 12/2007 | Ho | ........................ | H05K 5/0278 361/737 |
| 8,081,483 B2* | 12/2011 | Huang | ................. | G06K 19/077 361/752 |
| 2015/0195933 A1* | 7/2015 | Huang | ................. | H05K 5/0278 361/679.32 |

* cited by examiner

*Primary Examiner* — James Wu
*Assistant Examiner* — Hung Dang
(74) *Attorney, Agent, or Firm* — Guice Patents PLLC

(57) ABSTRACT

A flash drive structure includes an insulated base including an upper end, a first slot formed near the upper end, a lower end, two inclined guiding surfaces, a receiving space connected to the inclined guiding surfaces, a limiting tab disposed in the receiving space and two latches disposed on the two guiding inclined surfaces respectively; a circuit board including a surface, on which circuits and modules are mounted, and an extending portion, on which a plurality of interface elements are disposed, wherein the extending portion corresponds to the receiving space, the circuit board is mounted on a lateral surface of the insulated base through the extending portion positioned in the receiving space by the limiting tab; and a case having a hollow structure, housing the assembled insulated base and circuit board, wherein the case includes two notches configured to engage the latches.

5 Claims, 9 Drawing Sheets

FLASH DRIVE STRUCTURE

BACKGROUND OF THE INVENTION

Field of the Invention

The invention relates to a flash drive, and more particularly to a flash drive having low cost and easy assembly structure.

Description of the Related Art

As the universal serial bus (USB) interface and flash memory are so popular, USB flash drives are widely used as a data transmitting device between different electronic devices and the storage devices such as computers and cell phones.

The flash drive structure includes a circuit board and an insulated base. The circuit board bears USB interface circuits and integrated circuit chips with memory functions and is often assembled to the insulated base. The assembled circuit board and insulated base are afterwards mounted into a case. As the technology of flash drive develops, the integrated circuit chips and the interface have more and more complicated structures.

Although circuits and modules relevant to flash drives can be formed on a flat circuit board through physical layout process and the circuit board is mounted to a clip insulated base, the manufacturing cost is high and main elements must be provided by vendors. This does not meet the management cycle of plan-do-check-action (PCDA) inside a factory.

BRIEF SUMMARY OF THE INVENTION

If the circuits and modules relevant to flash drives are mounted on a circuit board without the physical layout process, then the circuits and modules may protrude from the circuit board and the insulated base must have corresponding structure to receive the circuits and modules. However, the manufacture of flash drives does not need to rely on vendors and thus meets the management cycle of PCDA, and the manufacturing cost is reduced.

An object of the invention is to provide a flash drive structure including a circuit board on which the circuits and modules are directly mounted. This increases the assembly of flash drive.

To achieve the object, the flash drive structure in accordance with an exemplary embodiment of the invention includes an insulated base including an upper end, a first slot formed near the upper end, a lower end, two inclined guiding surfaces, a receiving space connected to the inclined guiding surfaces, a limiting tab disposed in the receiving space and two latches disposed on the two guiding inclined surfaces respectively; a circuit board including a surface, on which circuits and modules are mounted, and an extending portion, on which a plurality of interface elements are disposed, wherein the extending portion corresponds to the receiving space, the circuit board is mounted on a lateral surface of the insulated base through the extending portion positioned in the receiving space by the limiting tab; and a case having a hollow structure, housing the assembled insulated base and circuit board, wherein the case includes two notches configured to engage the latches.

In another exemplary embodiment, the case further includes a second slot corresponding to the first slot, the upper end is even with an edge of the case when the insulated base is assembled to the housing.

In yet another exemplary embodiment, the insulated base further includes a plurality of recesses and openings corresponding to the circuits and the modules, and a spring arm adjacent to one of the openings corresponding to one of the modules.

In another exemplary embodiment, the insulated base further includes an enlarged head and a through hole formed on the enlarged head; the insulated base is externally mounted to a top end of the case.

In yet another exemplary embodiment, the flash drive structure further includes an external spring clip, wherein the insulated base further includes a third slot to which the external spring clip is joined.

In another exemplary embodiment, the external spring clip includes a folded wall on which at least one spring tab is formed and a clip plate extending downwards for a predetermined length; the external spring clip is joined to the insulated base through the engagement of the spring tab with the third slot so that the clip plate extending externally along a surface of the case.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
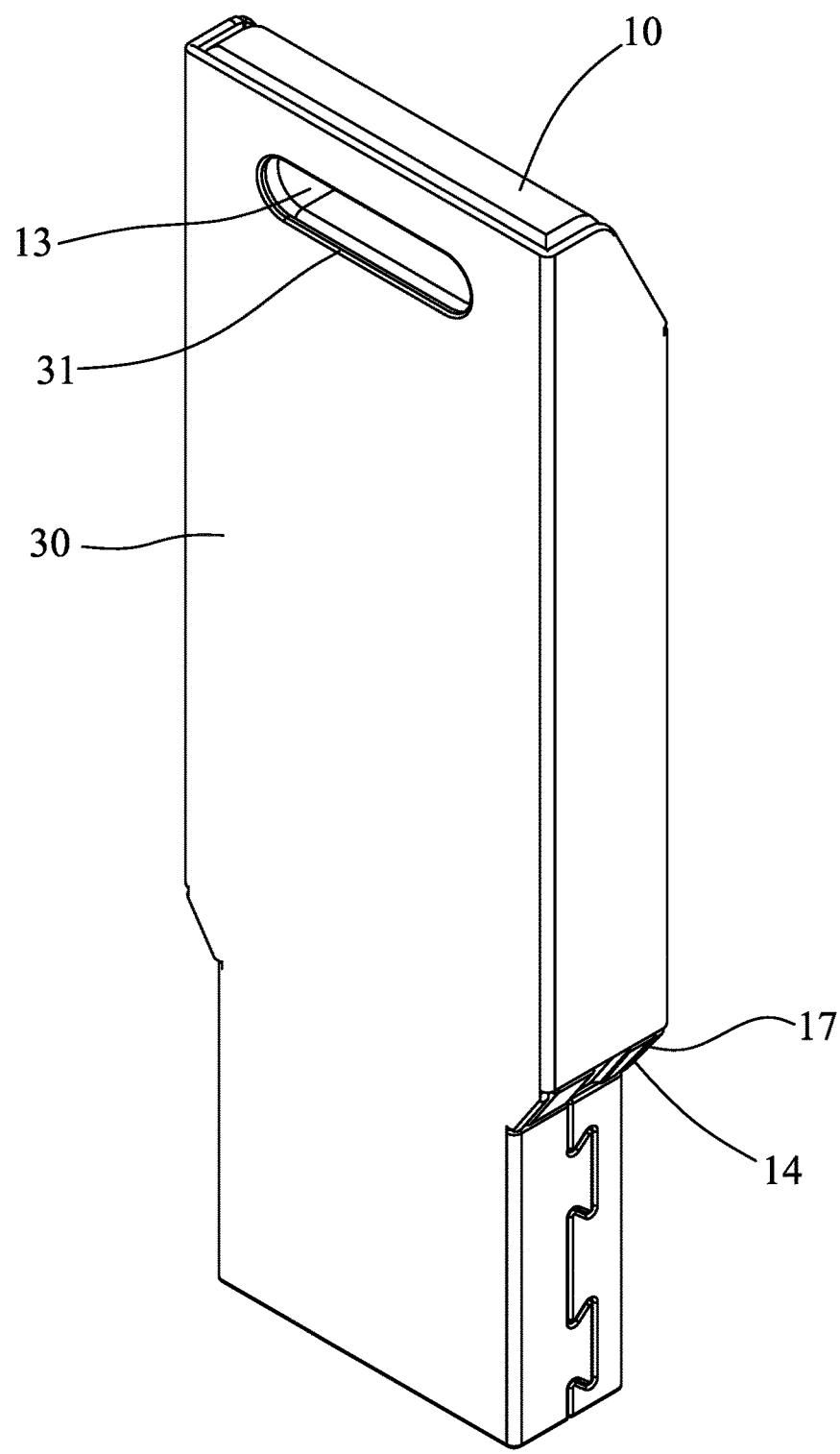
FIG. 1 is a perspective view of the first embodiment of a flash drive structure of the invention.
Figures 2, 2A:
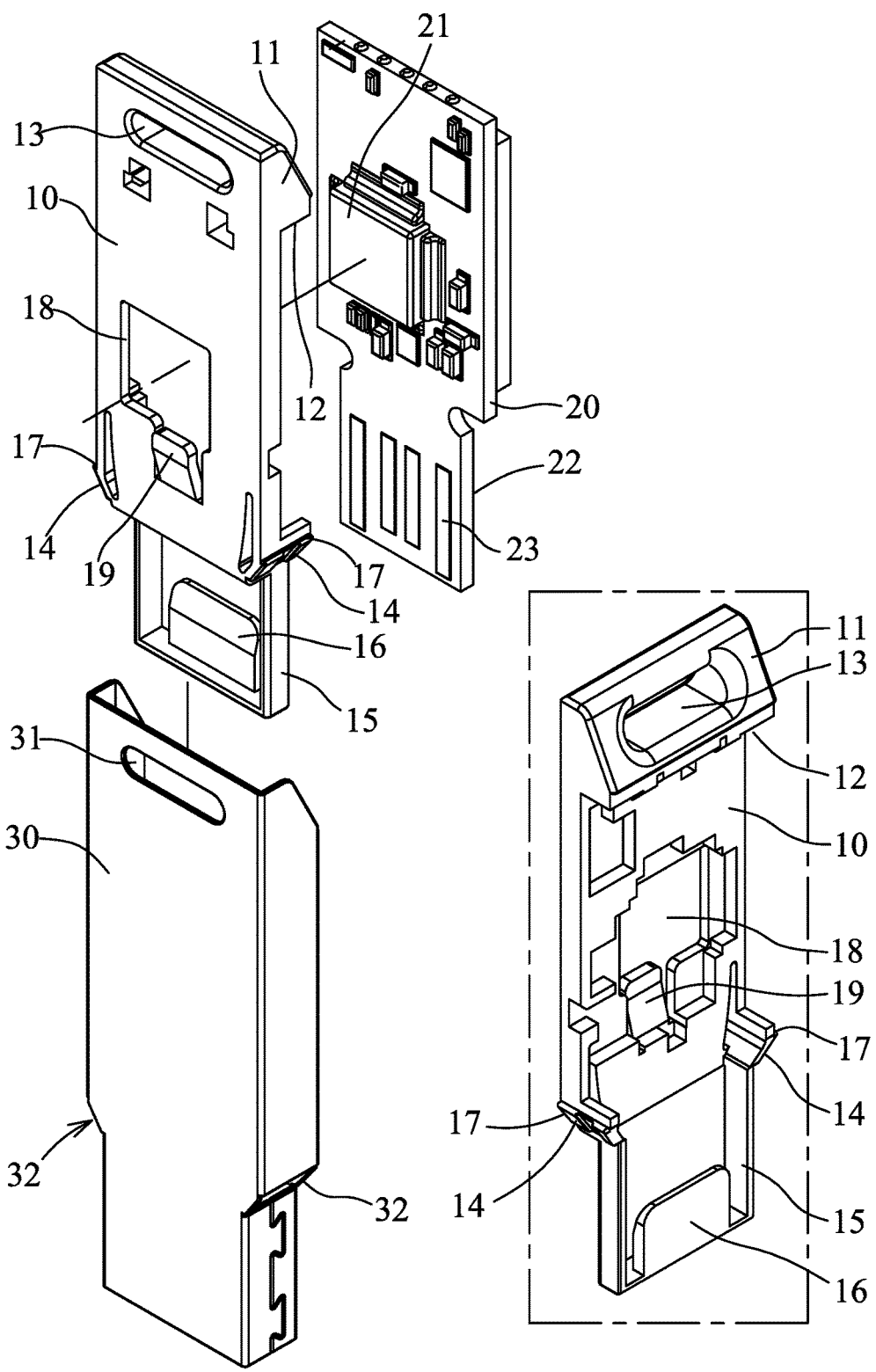
FIG. 2 is an exploded view of FIG. 1.
FIG. 2A is a perspective view of an insulated base of FIG. 2.

Referring to FIGS. 1 and 2, an embodiment of a flash drive structure of the invention includes an insulated base 10 and a circuit board 20 on which relevant circuits and modules are mounted. The circuit board 20 is assembled to the insulated base 10, and the assembled insulated base 10 and circuit board 20 are assembled to a case 30.

The insulated base 10 includes an upper end and an inclined guiding surface 11 to form an upper shoulder 12. The insulated base 10 further includes a first slot 13 formed on a central position of the inclined guiding surface 11. The insulated base 10 further includes a lower end, two inclined guiding surfaces 14 dispose near the lower end and a receiving space 15 adjacent to the inclined guiding surfaces 14. The insulated base 10 further includes a limiting tab 16 disposed in the receiving space 15 and two latches 17 disposed on the inclined guiding surfaces 14. As shown in FIG. 2A, the insulated base 10 further includes a plurality of recesses and openings formed on an inner surface thereof corresponding to the circuits and modules of the circuit board 20. An opening 18 of the insulted base 10 corresponds to a module 21 on the circuit board 20. A spring arm 19 extends from a lower end of the opening 18.

The circuit board 20 includes an extending portion 22 corresponding to the receiving space 15. A plurality of interface elements 23 are disposed on the extending portion 22. The circuit board 20 is assembled to the inner surface through an upper edge of the circuit board 20 abutting the upper shoulder 12 of the insulated base 10 and a lower edge of the circuit board 20 received in the receiving space and positioned therein by the limiting tab 16.

Figure 3:
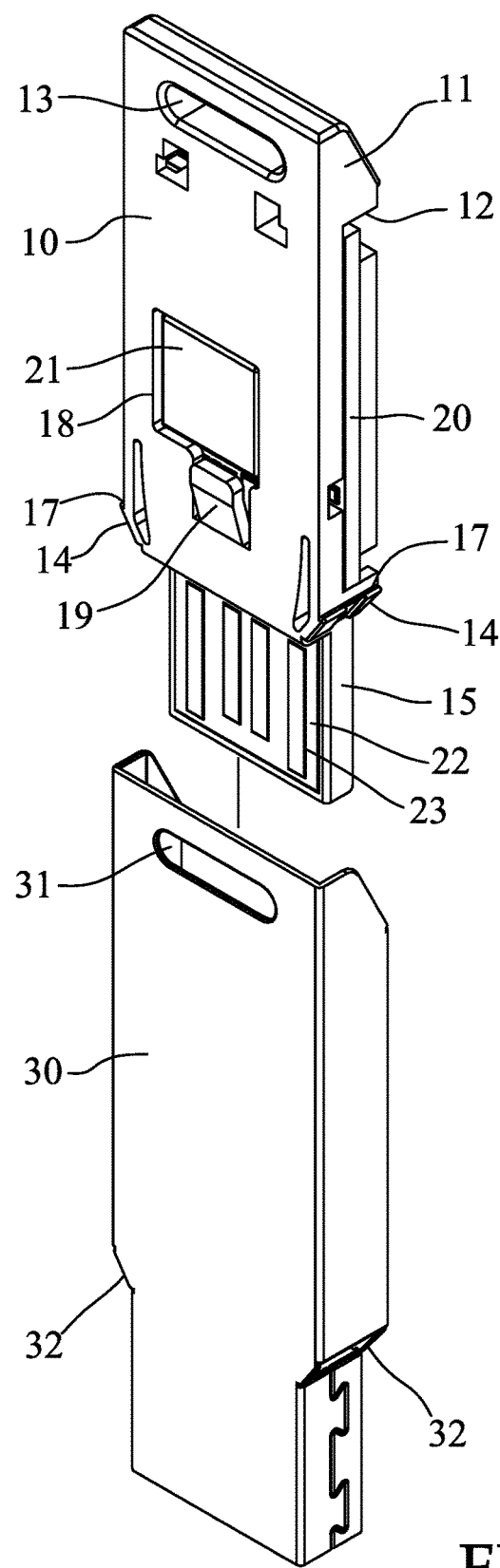
FIG. 3 depicts the circuit board of FIG. 2 ready to be assembled to a case of FIG. 2.

As shown in FIGS. 2 and 3, the case 30 is hollow and configured to receive the insulated base 10 and the circuit board 20. The case 30 includes a second slot 31 corresponding to the first slot 13 and two notches 32 corresponding to the two inclined guiding surfaces 14.

Figure 4:
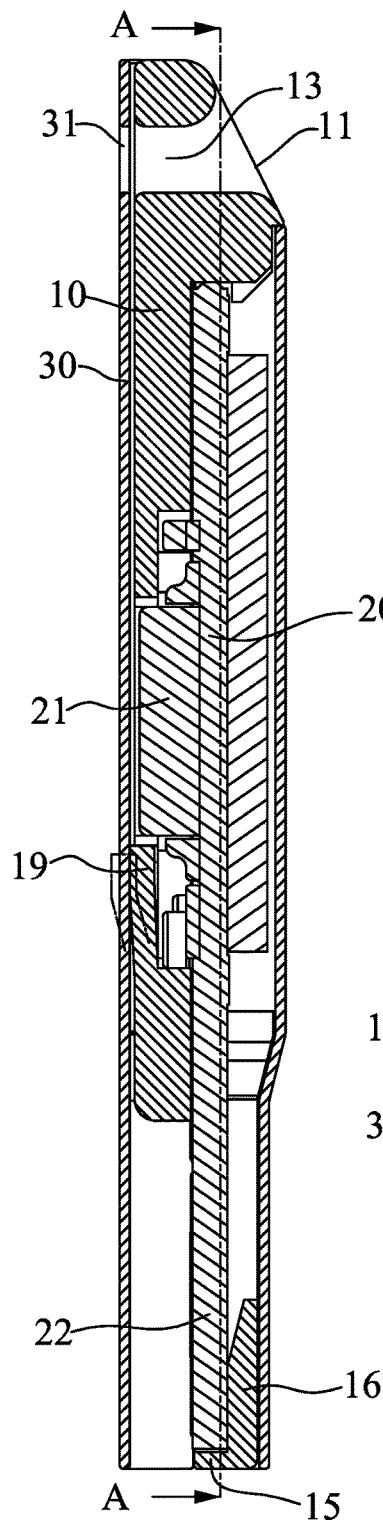
FIG. 4 is a cross section of the flash drive structure of FIG. 1.
Figure 5:
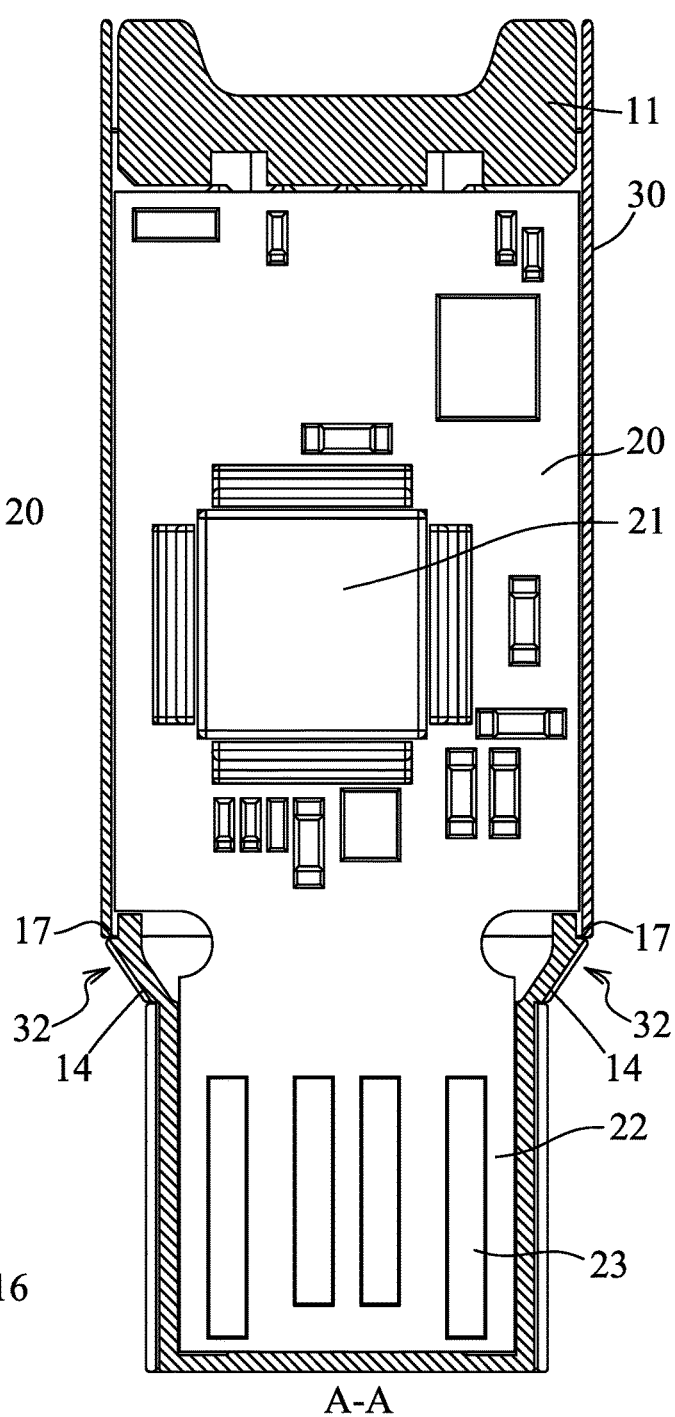
FIG. 5 is a cross section of the flash drive structure of FIG. 4 along a line A-A.

Referring to FIGS. 3-5, when the assembled insulated base 10 and circuit board 20 are inserted into the case 30, the assembled insulated base 10 and circuit board 20 is moved until the latches 17 engage the notches 32 (see FIG. 5), and the spring arm 19 is pushed by an inner wall of the case 30 so that the spring arm 19 props against the case 30 to position the assembled insulated base 10 and circuit board 20 (see FIG. 4). Thus, when the assembly of the flash drive is finished, the upper end of the insulated base 10 is even with a top edge of the case 30. Referring to FIGS. 2-9, the case 30 has an upper width located above the two notches 32 and a lower width located below the two notches 32, the upper width being wider than the lower width. Each of the insulated base 10 and the circuit board 20 have an upper width and a lower width corresponding to the upper width and the lower width of the case 30.

Figure 6:
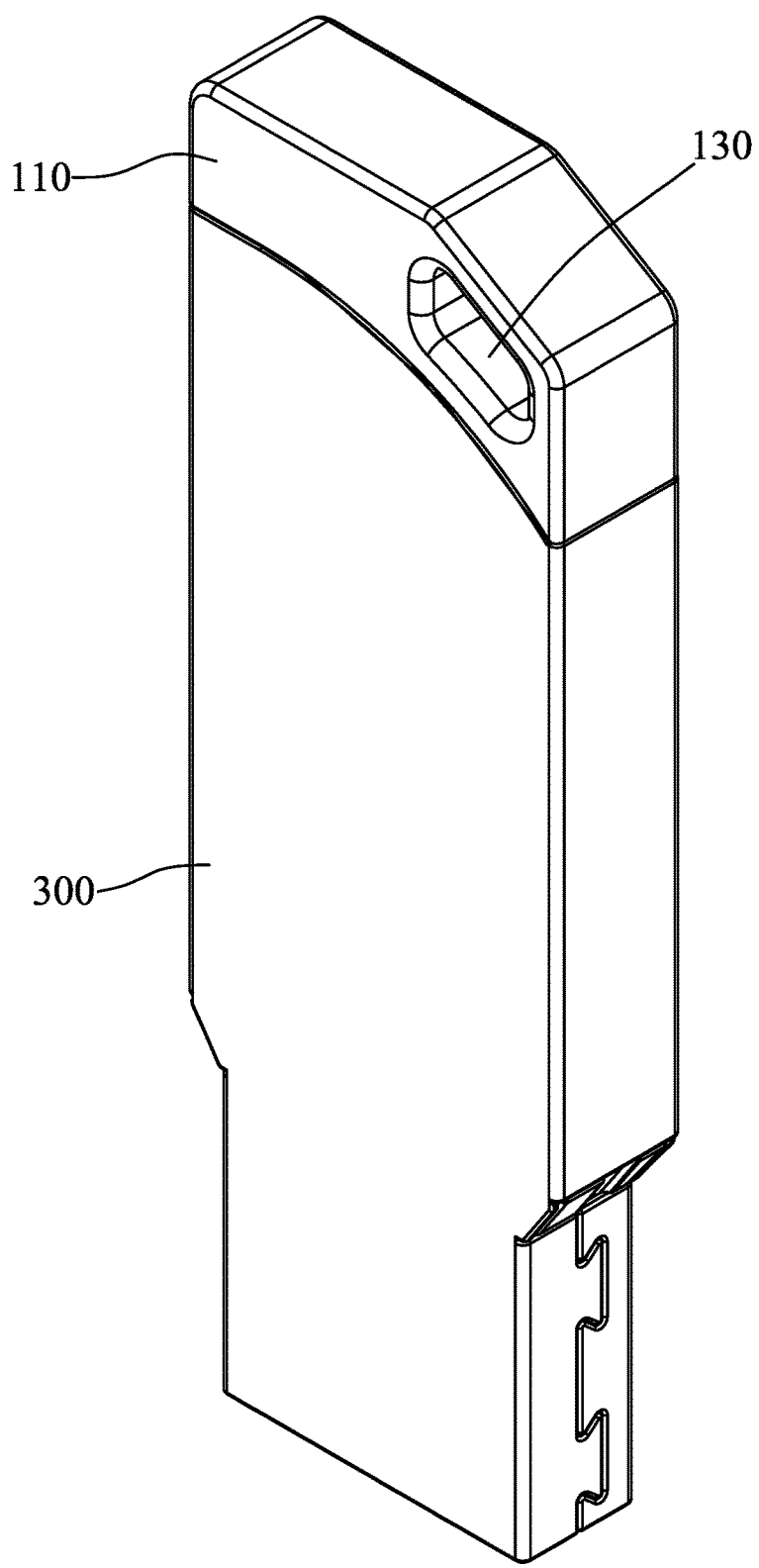
FIG. 6 is a perspective view of the second embodiment of a flash drive structure of the invention.
Figure 7:
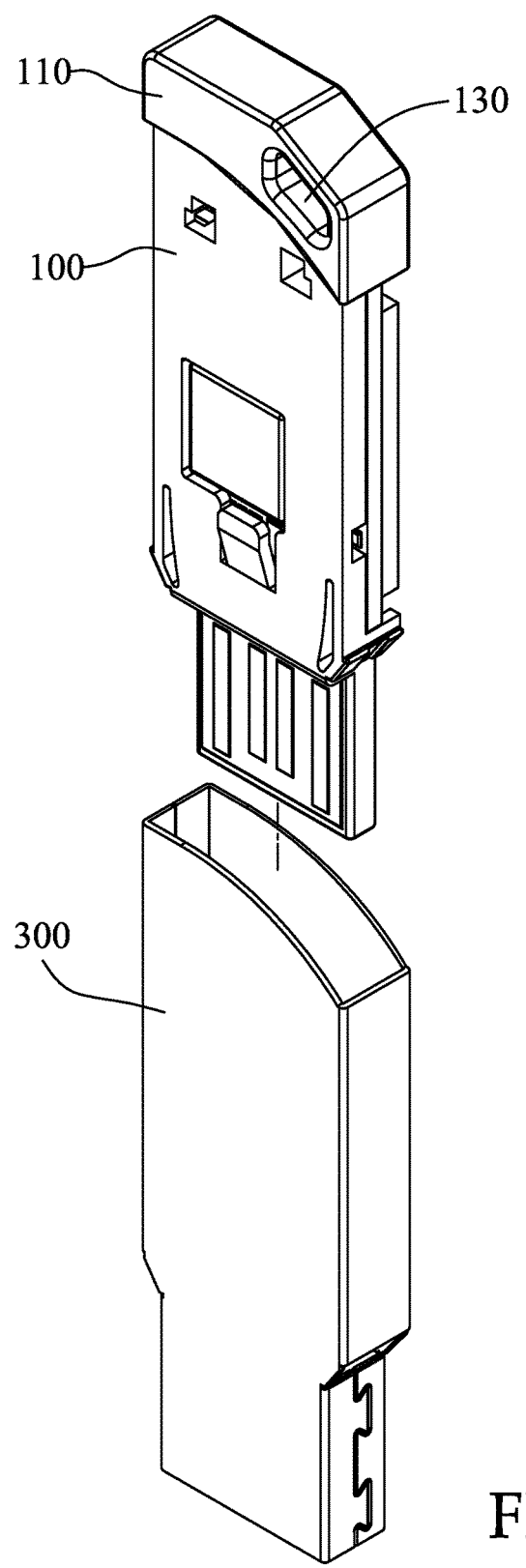
FIG. 7 depicts the circuit board of FIG. 6 ready to be assembled to a case of FIG. 6.

Referring to FIGS. 6 and 7, the insulated base 100 includes an enlarged head 110 and a through hole 130 formed on the enlarged head 110. The enlarged head 110 is externally positioned on a top end of the case 30 when the insulated base 110 is assembled to the case 30.

Figure 8:
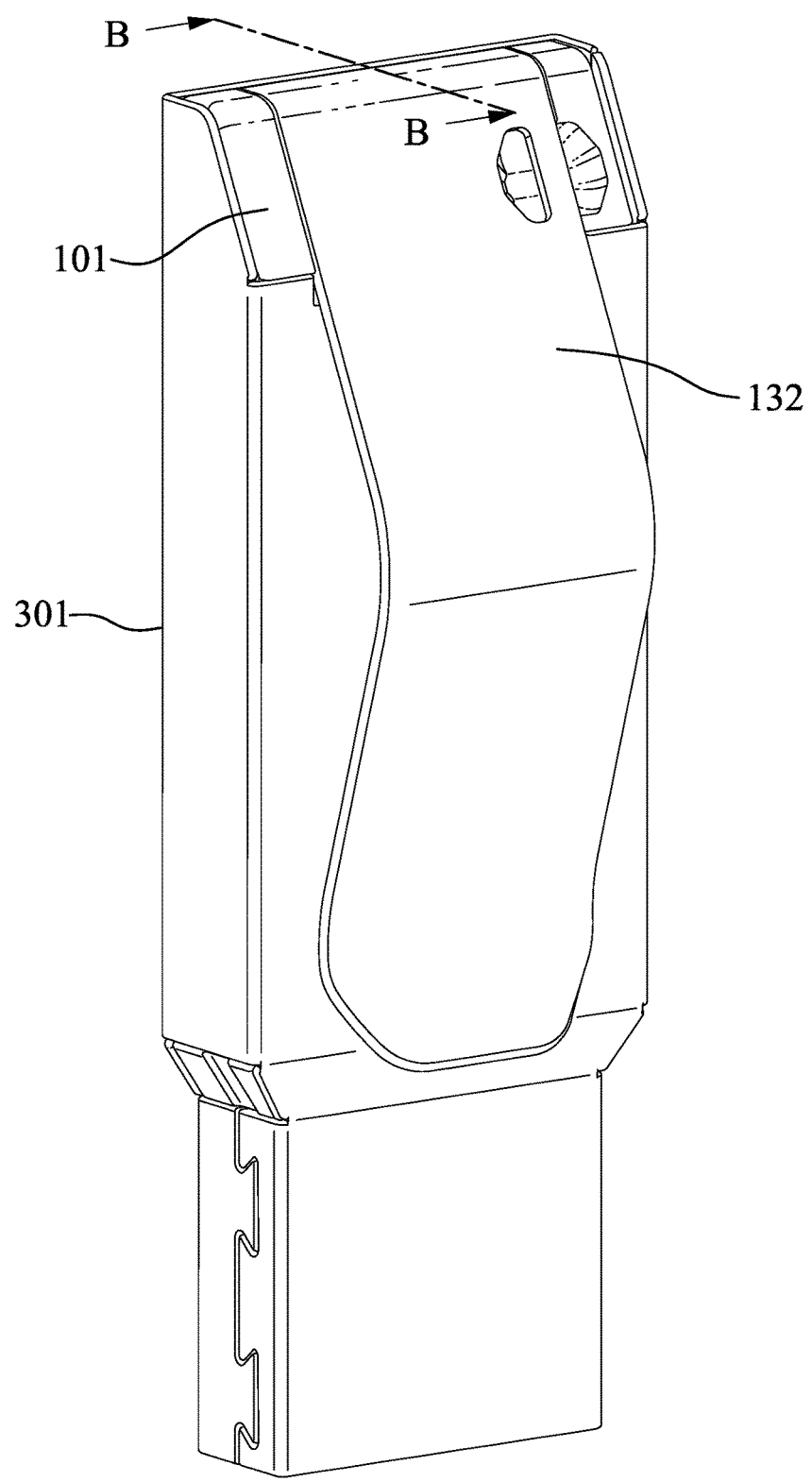
FIG. 8 is a perspective view of the third embodiment of a flash drive structure of the invention.
Figure 9:
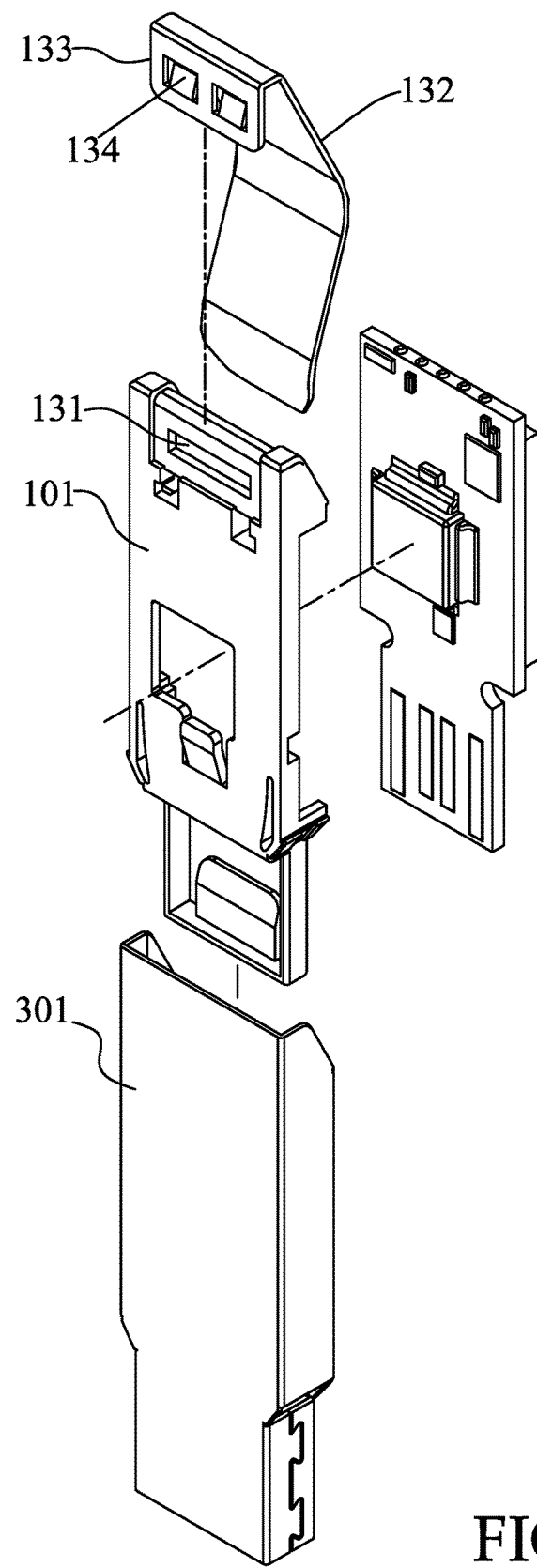
FIG. 9 is an exploded view of FIG. 8.
Figure 10:
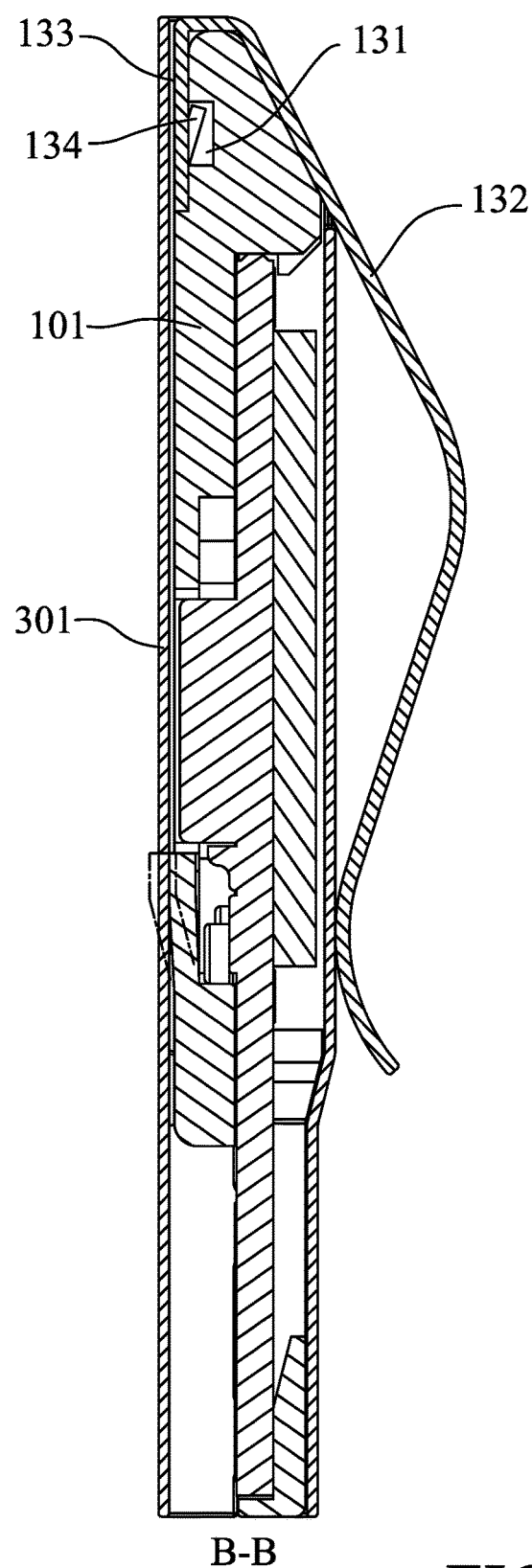
FIG. 10 is a cross section of the flash drive structure of FIG. 8 along a line B-B.

Referring to FIGS. 8-10, the insulated base 101 includes a third slot 131 to which an external spring clip 132 is mounted. In this embodiment, the external spring clip 132 has a folded wall 133 and a clip plate. Two spring tabs 134 are formed on the folded wall 133 by punching. The clip plate extends downwards for a predetermined length. When the external spring clip 132 is mounted to the insulated base 101 through the engagement of the spring tabs 134 with the third slot 131, and the clip plate extends externally along a surface of the case 30 to become a clip device.

Since the flash drive structure includes the circuit board 20 on which the circuits and modules are directly mounted, the factor does not rely on the circuit boards manufactured through physical layout process by vendors and can perform the management cycle of PCDA to reduce manufacture cost and speed assembly procedure.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flash drive structure, comprising:
   an insulated base comprising an upper end, a first slot formed near the upper end, a lower end, two inclined guiding surfaces, a receiving space located between the inclined guiding surfaces, a limiting tab disposed in the receiving space and two latches disposed on the two inclined guiding surfaces respectively;
   a circuit board comprising a surface, on which circuits and modules are mounted, and an extending portion, on which a plurality of interface elements are disposed, wherein the extending portion corresponds to the receiving space, the circuit board is mounted on a lateral surface of the insulated base with the extending portion positioned in the receiving space by the limiting tab; and
   a case having a hollow structure, housing the assembled insulated base and circuit board, wherein the case comprises two notches configured to engage the latches;
   wherein the case further comprises a second slot corresponding to the first slot, the upper end of the insulated base is aligned with an upper edge of the case when the insulated base is located in the case, the first slot extending through the insulated base and the second slot extending through the case and aligning with the first slot, the first slot of the insulated base and the second slot of the case defining a hole extending through the insulated base and the case;
   wherein the case has an upper width located above the two notches and extending to the upper end and a lower width located below the two notches and extending to the lower end, each of the insulated base and the circuit board has an upper width and a lower width corresponding to the upper width and the lower width of the case, the upper width of each of the case, the insulated base and the circuit board is wider than the lower width of each of the case, the insulated base and the circuit board, respectively.

2. The flash drive structure as claimed in claim 1, wherein the insulated base further comprises a plurality of recesses and openings corresponding to the circuits and the modules, and a spring arm located adjacent to one of the openings corresponding to one of the modules, the spring arm engaging an inner surface of the case.

3. The flash drive structure as claimed in claim 1, wherein the insulated base further comprises a head and a through hole formed on the head; the insulated base is externally mounted to a top end of the case.

4. The flash drive structure as claimed in claim 1 further comprises an external spring clip, wherein the insulated base further comprises a clip slot to which the external spring clip is joined.

5. The flash drive structure as claimed in claim 4, wherein the external spring clip comprises a folded wall on which at least one spring tab is formed and a clip plate extending downwards for a predetermined length; the external spring clip is joined to the insulated base through the engagement of the spring tab with the clip slot so that the clip plate extending externally along a surface of the case.

* * * * *